United States Patent [19]
Kahen

[11] Patent Number: 5,212,703
[45] Date of Patent: May 18, 1993

[54] SURFACE EMITTING LASERS WITH LOW RESISTANCE BRAGG REFLECTORS

[75] Inventor: Keith B. Kahen, Rochester, N.Y.

[73] Assignee: Eastman Kodak Company, Rochester, N.Y.

[21] Appl. No.: 836,569

[22] Filed: Feb. 18, 1992

[51] Int. Cl.$^5$ .............................................. H01S 3/19
[52] U.S. Cl. ........................................ 372/46; 372/45; 372/96; 372/99
[58] Field of Search ................. 372/45, 46, 92, 96, 372/99

[56] References Cited

U.S. PATENT DOCUMENTS 5,115,441 5/1992 Kopf et al. ............................ 372/45

OTHER PUBLICATIONS

Y. H. Lee, J. L. Jewell, A. Scherer, S. L. McCall, J. P. Harbison, and L. T. Florez, "Room-temperature Continuous-wave Vertical-cavity Single-quantum-well Microlaser Diodes", Electron. Lett., vol. 25, pp. 1377–1378, 1989.

R. S. Geels, S. W. Corzine, J. W. Scott, D. B. Young, and L. A. Coldren, "Low Threshold Planarized Vertical-cavity Surface Emitting Lasers", IEEE Photonics Technol. Letters, vol. 2, pp. 234–236, 1990.

*Primary Examiner*—James W. Davie
*Attorney, Agent, or Firm*—Raymond L. Owens

[57] ABSTRACT

A vertical cavity surface emitting laser is disclosed including a lower cladding layer of a particular conductivity type deposited on the semiconductor substrate, having multiple periods of semiconductor layers of varying index of refraction so deposited as to form a λ/2 Bragg reflector; and an upper cladding layer of opposite conductivity type having multiple periods of semiconductor layers of varying index of refraction so deposited as to form a multilayer reflector.

8 Claims, 3 Drawing Sheets

LASER BEAM

SURFACE EMITTING LASERS WITH LOW RESISTANCE BRAGG REFLECTORS

FIELD OF THE INVENTION

The present invention related to improved Bragg reflectors for vertical cavity surface emitting lasers.

Vertical cavity surface emitting lasers (VCSEL) have a number of attractive properties for optoelectronic applications, such as, requiring less processing than typical edge emitting lasers. An example of a prior art VCSEL is illustrated in FIG. 1. In the figure, upon a n+-GaAs substrate 10, is grown a n-type cladding layer, 12. This cladding layer 12 has twenty-two periods of alternating layers of GaAs and AlAs. The thicknesses of the GaAs and AlAs layers are chosen so as to form a quarter-wavelength ($\lambda/4$) reflector, as discussed in more detail below. On the surface of layer 12 is formed an active region 14, which includes an InGaAs active layer 18, surrounded by a (GRINSCH) graded index separate confinement heterostructure structure 16. Upon 14 is formed the p-type cladding layer, 20, which, as for the n-type cladding layer, provides a $\lambda/4$ reflector. For the p-side reflector, twenty-four periods of alternating GaAs and AlAs layers are employed, such that the reflectivity of the p-side reflector is slightly larger than that of the n-side reflector. On the surface of the p-cladding layer is a p+-GaAs cap, 22, upon which is formed an ohmic metal, 24. A patterned ohmic metal 26 is deposited on the substrate 10, where the patterning is used to allow laser output through the substrate. As can be seen from FIG. 1, VCSEL are compact, have very small threshold currents and low output beam divergences, and operate stably in a single longitudinal mode. As a result of their compact size, the total volume of their gain media is very small. Consequently, in order to satisfy the requirements for lasing that the total losses equals the total gains, VCSEL require mirrors with very high reflectances, e.g., 99.9%. In order to attain these high reflectivities, the mirrors are typically made of a stack of alternating, high-low index of refraction, $\lambda/4$ layers, as discussed above in reference to FIG. 1. For example, for an InGaAs quantum-well active layer operating at a wavelength of 0.98 $\mu$m, the quarter-operating wavelength stack can be made out of twenty-two periods of 0.07 $\mu$m of GaAs alternating with 0.083 $\mu$m of AlAs, giving a calculated reflectivity of 99.95% (see FIG. 2a). The problem with using a mirror composed of AlAs is that the resulting cladding layers have a large series resistance (Y. H. Lee, J. L. Jewell, A. Scherer, S. L. McCall, J. P. Harbison, and L. T. Florez, "Roomtemperature continuous-wave vertical-cavity single- quantum-well microlaser diodes," Electron. Lett., vol. 25, pp. 1377-1378, 1989). This large resistance is due to two factors: the large potential barrier at the AlAs-GaAs interface and the low carrier mobility in AlAs. The problem with the large potential barrier has been addressed by Geels et. al. (R. S. Geels, S. W. Corzine, J. W. Scott, D. B. Young, and L. A. Coldren, "Low threshold planarized vertical-cavity surface emitting lasers," IEEE Photonics Technol. Letters, vol. 2, pp. 234-236, 1990) who graded the AlAs-GaAs interfaces.

It is an object of this patent to correct the problem of the relatively small carrier mobility in AlAs, which is especially severe for the n-side mirror The electron mobility in GaAs and AlAs at a carrier density of $1.0 \times 10^{18}$ cm$^{-3}$ is approximately 2800 and 90 cm$^2$/V-s, respectively, as illustrated in FIG. 2a.

SUMMARY OF THE INVENTION

Since electron flow through 1.83 $\mu$m of AlAs (for the twenty-two period mirror discussed above) results in high series resistance, this invention employs a mirror containing less AlAs, while still maintaining the same reflectivity. Our solution is to use a Bragg reflector instead of a $\lambda/4$ reflector for the n-side mirror (see FIG. 2b). Since Bragg reflectors only require a perturbation in the index of refraction distribution every half-wavelength, instead of a quarter-wavelength each for the high and low index materials, Bragg reflectors can be composed out of less AlAs. For example, in order to attain a reflectivity of 99.95%, equivalent to that of the twenty-two period $\lambda/4$ reflector discussed above, our Bragg reflector requires thirty-six periods of 0.035 $\mu$m of AlAs and 0.110 $\mu$m of GaAs, for a total AlAs thickness of 1.26 $\mu$m. In comparison with the twenty-two period $\lambda/4$ reflector discussed above, devices in accordance with this invention can have approximately a 26% drop in the n-side series resistance. This drop in resistance is entirely due to the higher overall mobility of carriers in the Bragg reflector (FIG. 2b) compared to that of the $\lambda/4$ reflector (FIG. 2a).

DETAILED DESCRIPTION OF THE PREFERRED EMBODIMENTS

According to the preferred embodiment, a vertical cavity surface emitting laser (VCSEL) is constructed by incorporating in the laser cavity a $\lambda/2$ Bragg reflector in the exit-beam cladding layer, instead of the conventional usage of a $\lambda/4$ reflector, thereby reducing the total electrical resistance and heat dissipation of the device.

Figure 3:
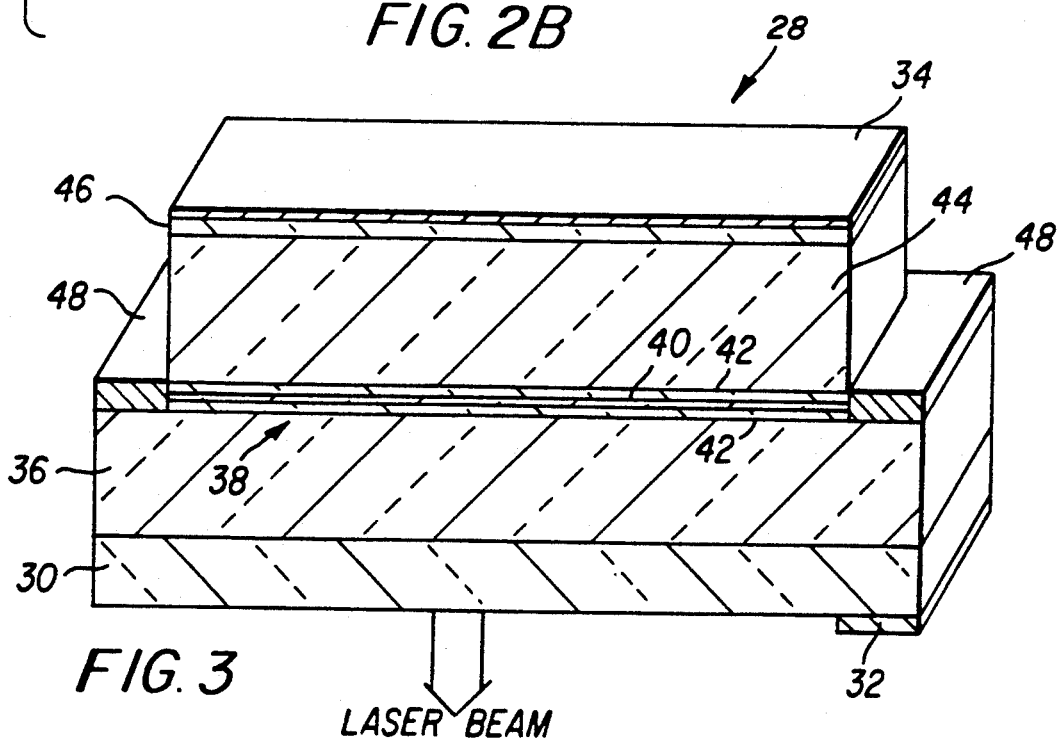
FIG. 3 depicts a VCSEL in accordance with this invention.

FIG. 3 shows a particular embodiment of this invention of a vertical cavity surface emitting laser 28 in which the substrate 30 is highly doped n+-GaAs In general, the substrate does not need to be composed of n+-GaAs. It can be composed of any highly conductive semiconductive material as long as the remaining layers can be grown epitaxially upon it and the laser emission passes unattenuated through this layer. The remaining sections of the laser are comprised of a series of individual semiconductive layers of predetermined thicknesses and doping types, arranged epitaxially on substrate 30, with ohmic metal contacts 32 and 34 located at the bottom and top of the vertical cavity laser 28, respectively. The preferred embodiment is constructed so as to emit light through the substrate 30, although other embodiments which emit radiation in the opposite direction are possible Light emission through the ohmic metal contact 32 is obtained by patterning the metal deposition on substrate 30.

Upon substrate 30 is deposited a lower cladding layer 36, which includes thirty-six n-type alternating layers of 0.11 $\mu$m of GaAs and 0.035 $\mu$m of AlAs, so as to form a multilayer reflector. These thicknesses are required for free-space radiation of the 0.98 $\mu$m light produced by the device described herein and, for other devices, would be scaled in proportion to the desired wavelength by methods well known in the art. The lower cladding layer 36 is doped with an n-type dopant material, such as, Si or Sn, to a concentration from $10^{17}$ to $10^{19}$ atoms/cm$^3$, with a preferred density of $10^{18}$/atoms/cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy or Atomic Layer Epitaxy) which accomplish epitaxial layers of controlled thicknesses and dopings, may be equally employed.

As is well know, the lower cladding layer 36 forms part of the optical cavity of the laser and reflects a portion of the light generated in the laser back into the region of optical activity The reflectivity of these layers in the preferred embodiment is 99.95%, as is typically required for vertical cavity geometries. The combined choice of the thicknesses and optical indices of these layers is critical to this invention.

Figure 1:
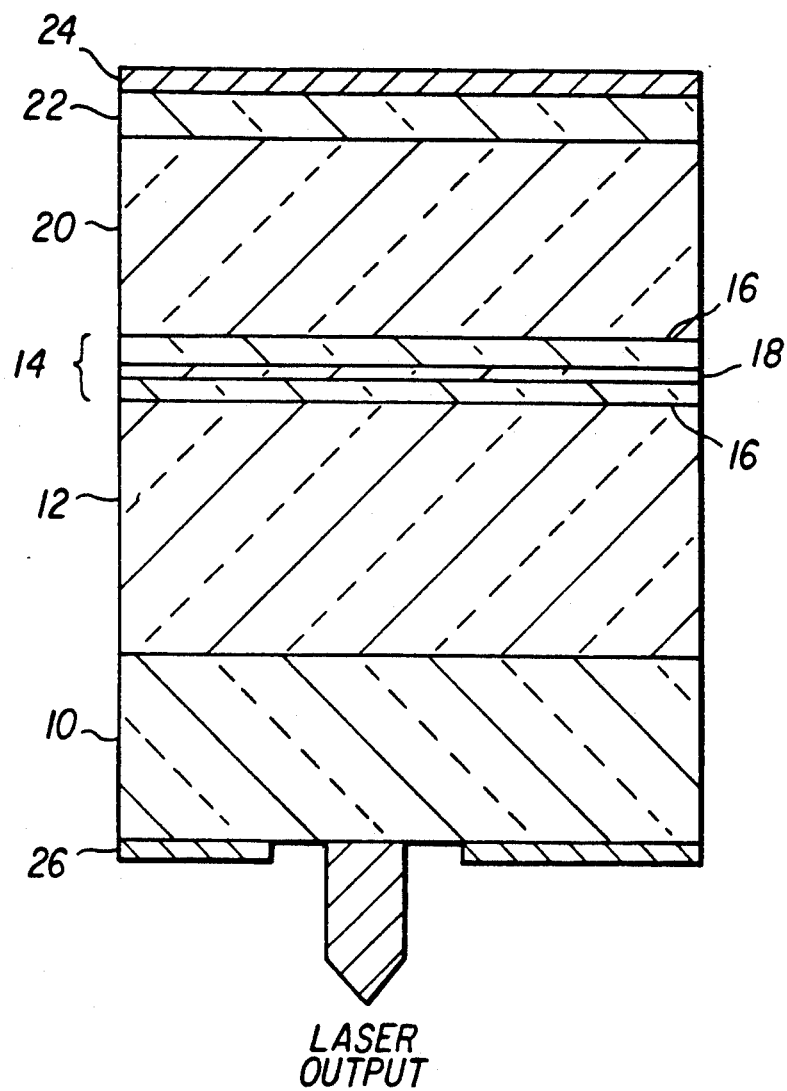
FIG. 1 depicts a prior art VCSEL.
Figure 2A:
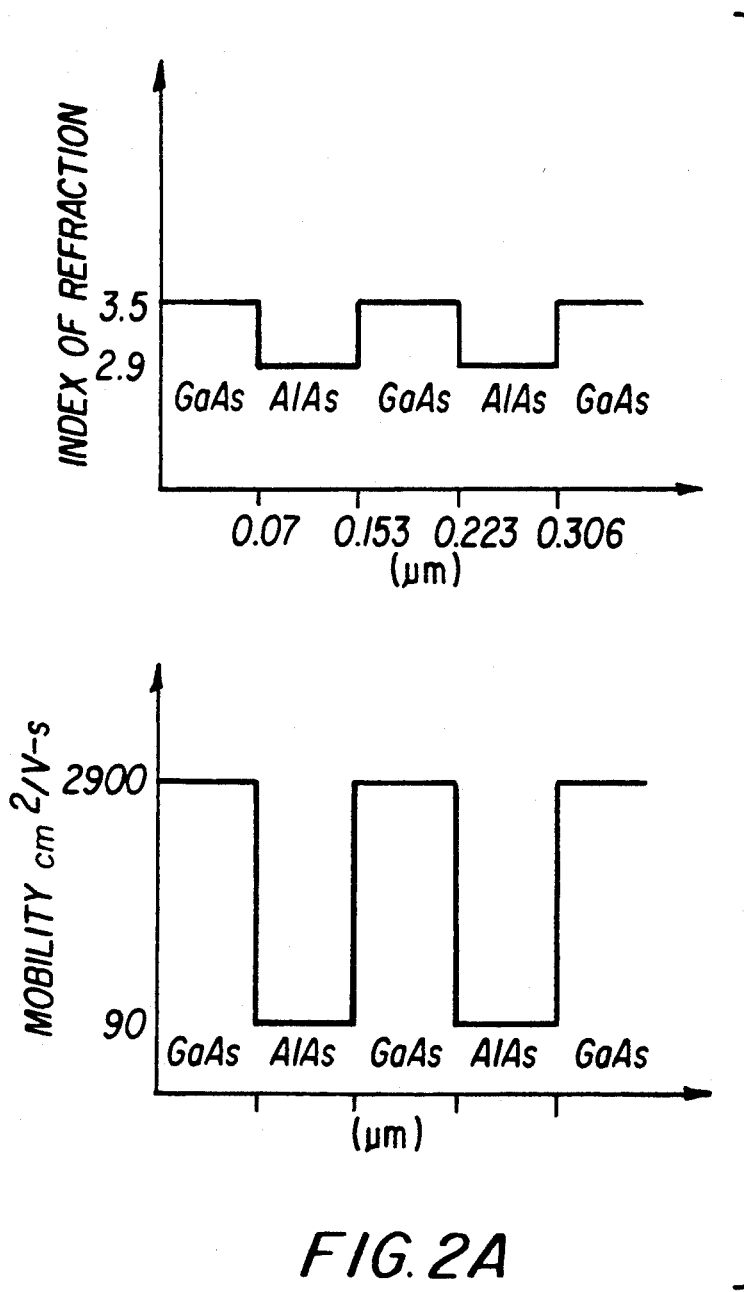
FIGS. 2a and 2b are graphical representations of the distributed mirror reflectors of FIGS. 1 and 3 respectively.
Figure 2B:
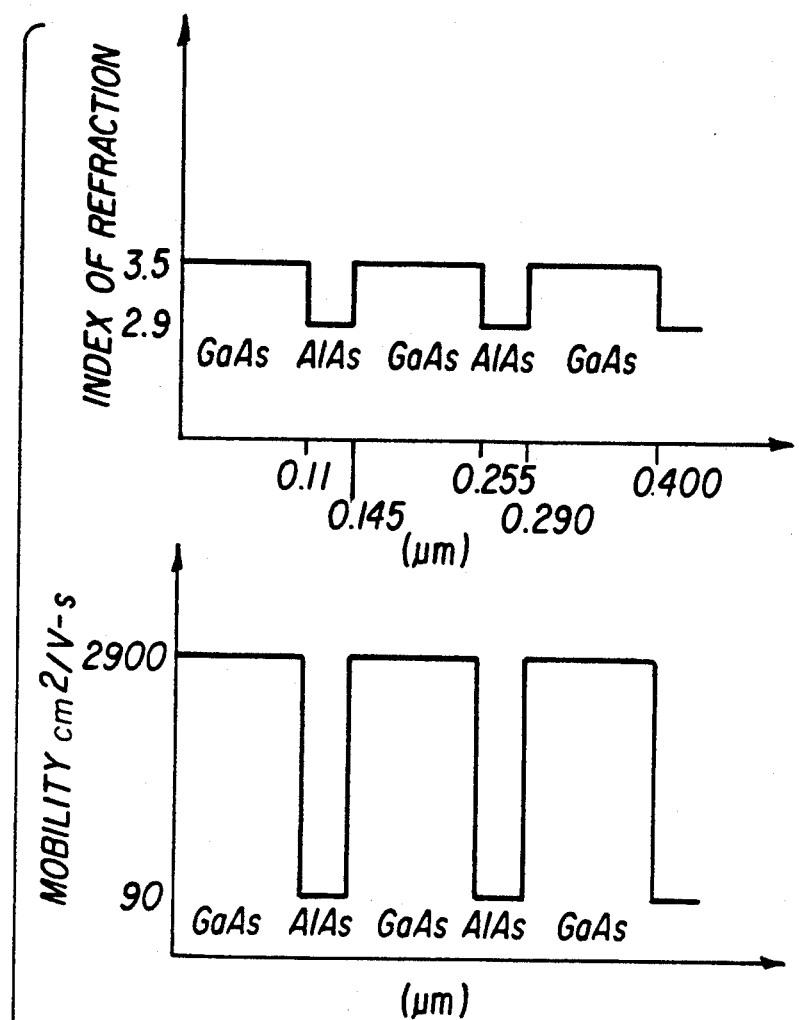

FIG. 2b illustrates graphically the layer thicknesses and spatial variation of the index of refraction appropriate to the lower cladding layer 36 for the FIG. 3 embodiment. Typical tolerances in layer thicknesses are on the order of 10 Å. The differences between the layer thicknesses in the current invention and in the prior art are seen to be much greater than the typical allowed tolerances.

In the active region 38, light is produced as a result of the recombination of electrons and holes injected from the lower and upper cladding layers, respectively. The central portion of this region, active layer 40, is composed of $In_{0.15}Ga_{0.85}As$, having a typical thickness from 10 to 1000 Å, preferably 100 Å (in which case it is called a quantum well active layer), whose bandgap is chosen to be smaller than that of the materials in the cladding layers, as is conventionally practiced. It should be noted that the active layer need not be composed of InCaAs. It can be formed of any semiconductive material whose emitted radiation is transparent to the remaining layers of the vertical cavity laser. In addition, instead of a single quantum well, it can be composed of multiple quantum wells. As may be appreciated by those skilled in the art, it is important that the band gap of the active layer be matched to the periodicity of the reflectors so that the period of the Bragg reflector in lower cladding layer 36 is half the period of the radiation emitted from active layer 40. The active layer 40 is surrounded above and below by a confinement region 42 composed of $Al_{0.5}Ga_{0.5}As$, whose bandgap is greater than that of the active layer, as is conventional for quantum well lasers. Instead of a uniform region of $Al_{0.5}Ga_{0.5}As$, confinement region 42 can also be composed of a GRINSCH structure, as is commonly practiced in the art. In the GRINSCH structure, the Al composition of the confining layers is graded from approximately 20% Al, adjacent to the active layer, to 50% Al, adjacent to the n- and p-type cladding layers. The preferred method of growth of the active and confinement layers is also M3E or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

An upper cladding layer 44 is formed epitaxially on the active region 38 and comprises alternate p-type layers of GaAs and AlAs. FIG. 2a shows the thicknesses and indices of refraction of these layers. These parameters are chosen so as to accomplish a λ/4 multilayer reflector, as is conventionally employed in surface emitting lasers in both lower and upper cladding layers for the purpose of distributed optical reflection. The preferred method of epitaxial deposition and the typical dopant concentration range for the p-type cladding layer are similar to those given for the n-type cladding layer in the foregoing description. As discussed by Geels et. al. (ibid) as a means of reducing the series resistance of the multilayer reflectors, the GaAs-AlAs interfaces can be graded in both the upper and lower cladding layer reflectors. As is commonly practiced, a highly p-doped cap of GaAs 46 is deposited epitaxially on the λ/4 reflector, while a layer of Au 34 is deposited on the cap to form an ohmic electrical contact to it over the entire cross sectional area of the vertical cavity laser 28. The lateral extent of the device perpendicular to the direction of optical emission is additionally defined by the implantation of oxygen ions 48 in sufficient concentration to disorder the active layer, as is commonly practiced. Optical confinement may additionally be achieved by photolithographically defining and etching the upper cladding layer 44, as shown in FIG. 3.

As is well known, the conduction of current through cladding layers of opposite conductivity types and carrier confinement in the active layer result in gain and optical emission in the active region Since this gain is not sufficiently high in practically realizable structures to achieve lasing action for a single optical pass, the cavity light must be reflected back into the region of optical gain, as conventionally accomplished by λ/4 reflectors imbedded in the upper and lower cladding layers. Because the mobility of carriers in the multilayer reflectors is not equal in the different layers, the electrical resistance is dominated by the more resistive layer when the layers are of comparable thicknesses (as is conventionally practiced). In this embodiment, the mobility of electrons in the reflector's AlAs layers is low. Because the AlAs layers are thin in the preferred embodiment, the resistance of these layers is decreased and heat dissipation during device operation is consequently reduced, leading to longer device lifetimes and greater longitudinal mode stability.

ADVANTAGES

Our proposed device enables operation of VCSELs with a smaller series resistance than currently available devices, without a drop in the mirror reflectivities. The means of achieving this device requires no more additional processing than used in current VCSELs. The drop in series resistance will lead to longer device lifetimes and greater longitudinal mode stability.

The invention has been described in detail with particular reference to certain preferred embodiments thereof, but it will be understood that variations and modifications can be effected within the spirit and scope of the invention.

What is claim is:

1. A vertical cavity surface emitting laser, comprising:
   (a) a semiconductor substrate of one conductivity type;
   (b) a lower cladding layer of similar conductivity type deposited on the semiconductor substrate, having multiple periods of semiconductor layers of varying index of refraction so deposited as to form a λ/2 Bragg reflector;

(c) a semiconductor active layer formed on the lower cladding layer;

(d) an upper cladding layer of opposite conductivity type deposited on the semiconductor active layer, having multiple periods of semiconductor layers of varying index of refraction so deposited as to form a multilayer reflector;

(e) deposited on the upper cladding layer; and (f) electrically conductive layers, deposited on the substrate and cap layers.

2. The vertical cavity surface emitting laser of claim 1 in which the conductivity of the substrate is either n- or p-type.

3. The vertical cavity surface emitting laser of claim 1 in which the substrate is composed of GaAs, the cladding layers of AlGaAs, and the active layer of InGaAs.

4. The vertical cavity surface emitting laser of claim 1 in which the active layer comprises either a single or multiple quantum wells 5. The vertical cavity surface emitting laser of claim 1 in which the multilayer reflector formed in the upper cladding layer is either a λ/4 reflector or a λ/2 Bragg reflector.

6. The vertical cavity surface emitting laser of claim 1 in which a GRINSCH structure surrounds the active layer so as to maximize the optical confinement factor and minority carrier capture.

7. The vertical cavity surface emitting laser of claim 1 in which the semiconductor interfaces of the multilayer reflectors are compositionally graded so as to achieve lower resistance to current flow.

8. The vertical cavity surface emitting laser of claim 1 in which the substrate side conductive material is patterned so as to enable light output through the bottom surface of the laser.

* * * * *

UNITED STATES PATENT AND TRADEMARK OFFICE
CERTIFICATE OF CORRECTION

PATENT NO. : 5,212,703
DATED : May 18, 1993

INVENTOR(S) : Keith B. Kahen et al

It is certified that error appears in the above-identified patent and that said Letters Patent is hereby corrected as shown below:

Item [76],
On the title page, inventor should read:
--Keith B. Kahen, Rochester, N.Y.; Gilbert A. Hawkins, Rochester, N.Y.--.

Signed and Sealed this

Eleventh Day of July, 1995

Attest:

BRUCE LEHMAN

*Attesting Officer*   *Commissioner of Patents and Trademarks*